(12) United States Patent
Li et al.

(10) Patent No.: US 6,636,416 B2
(45) Date of Patent: Oct. 21, 2003

(54) ELECTRONIC ASSEMBLY WITH LATERALLY CONNECTED CAPACITORS AND MANUFACTURING METHOD

(75) Inventors: Yuan-Liang Li, Chandler, AZ (US); Chee-Yee Chung, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 262 days.

(21) Appl. No.: 09/881,342

(22) Filed: Jun. 14, 2001

(65) Prior Publication Data

US 2002/0191368 A1 Dec. 19, 2002

(51) Int. Cl.[7] .................... H01G 4/228; H05K 1/18
(52) U.S. Cl. .................... 361/306.1; 361/763
(58) Field of Search ............... 361/301.1, 306.1, 361/306.2, 306.3, 763, 321.2; 29/25.42; 251/678, 723

(56) References Cited

U.S. PATENT DOCUMENTS

| 4,852,227 A | 8/1989 | Burks ........................ 29/25.42 |
| 4,883,920 A | 11/1989 | Tanabe et al. .............. 174/68.5 |
| 5,444,298 A | 8/1995 | Schutz ....................... 257/691 |
| 5,798,567 A | 8/1998 | Kelly et al. ................. 257/723 |
| 5,883,428 A | 3/1999 | Kabumoto et al. ......... 257/691 |
| 5,973,928 A | 10/1999 | Blasi et al. ................. 361/760 |
| 6,272,020 B1 | 8/2001 | Tosaki et al. ............... 361/763 |
| 6,344,961 B1 | 2/2002 | Naito et al. ................. 361/302 |
| 6,346,743 B1 * | 2/2002 | Figueroa et al. ............ 257/723 |
| 6,351,880 B1 * | 3/2002 | Palmer et al. ............. 29/25.42 |
| 6,407,929 B1 * | 6/2002 | Hale et al. .................. 361/763 |
| 6,446,317 B1 * | 9/2002 | Figueroa et al. ........... 29/25.42 |
| 6,483,692 B2 * | 11/2002 | Figueroa et al. ......... 361/308.1 |
| 6,532,143 B2 * | 3/2003 | Figueroa et al. ......... 361/301.4 |

FOREIGN PATENT DOCUMENTS

| DE | 10019839 | 6/2001 | .......... H01G/4/005 |
| EP | 0732107 | 9/1996 | .......... A61K/51/04 |

* cited by examiner

Primary Examiner—Adolf D. Berhane
(74) Attorney, Agent, or Firm—Schwegman, Lundberg, Woessner & Kluth, P.A.

(57) ABSTRACT

An electronic assembly includes multiple discrete capacitors (504, FIG. 5), which are surface mounted to or embedded within an electronic housing, such as an integrated circuit package (1504, FIG. 15). One or more side terminals (510) of adjacent capacitors are electrically connected through lateral connections (512, 620, FIGS. 5, 6). These lateral connections provide an extremely low lateral inductance current path between the discrete capacitors.

29 Claims, 9 Drawing Sheets

ELECTRONIC ASSEMBLY WITH LATERALLY CONNECTED CAPACITORS AND MANUFACTURING METHOD

TECHNICAL FIELD OF THE INVENTION

The present invention relates generally to apparatus for providing capacitance to an electronic circuit, and more particularly to providing capacitance to an integrated circuit load, and methods of manufacturing an electronic assembly that includes discrete capacitors electrically attached to a housing.

BACKGROUND OF THE INVENTION

Electronic circuits, and particularly computer and instrumentation circuits, have in recent years become increasingly powerful and fast. As circuit frequencies continue to escalate, with their associated high frequency transients, noise in the power and ground lines increasingly becomes a problem. This noise can arise due to inductive and capacitive parasitics, for example, as is well known. To reduce such noise, capacitors known as bypassing capacitors are often used to provide a stable signal or stable supply of power to the circuitry. Capacitors can also be used to suppress unwanted radiation, to dampen voltage overshoot when an electronic device (e.g., a processor) is powered down, and to dampen voltage droop when the device powers up.

Bypassing capacitors are generally placed as close as practical to a die load or "hot spot" in order to increase the capacitors' effectiveness. Often, the bypassing capacitors are surface mounted to the die side or land side of the package upon which the die is mounted, or embedded within the package itself. FIG. 1 illustrates a cross-section of an integrated circuit package 102 having die side capacitors 106 ("DSC"), land side capacitors 108 ("LSC"), and embedded chip capacitors 110 ("ECC") in accordance with the prior art. Die side capacitors 106, as their name implies, are mounted on the same side of the package 102 as the integrated circuit die 104. In contrast, LSCs 108 are mounted on the opposite side of the package 102 as the die 104. ECCs 110 are embedded within the package 102.

Typically, multiple bypassing capacitors are used to provide the desired capacitance. FIG. 2 illustrates a bottom view of an integrated circuit package 202 having multiple LSCs 204, which are electrically connected to pads 206 on the bottom of the package 202 in accordance with the prior art. The terminals 208 of each capacitor 204 are connected to a different set of pads 206. The cross-hatching on terminals 208 is intended to indicate that terminals 208 and pads 206 typically are connected, in an alternating manner, to power and ground planes (not shown) within the package 202. Analogous figures could be used to illustrate the connection of DSC terminals to package pads, or the connection of ECC terminals to vias within the package.

FIG. 3 illustrates a cross-sectional view of a portion of the integrated circuit package 202 and LSCs 204 of FIG. 2 along section lines 3—3. When LSCs are multi-layer capacitors, as shown, each capacitor 204 includes multiple planes 302, 304 of conductive material, separated by layers of dielectric material. Although only six planes are shown, numerous planes are usually present (e.g., hundreds of planes).

Typically, conductive planes 302, 304 are configured so that alternating planes connect to alternating terminals 306, 308 around the capacitor. This enables terminals 306, 308 and planes 302, 304 to be connected, in an alternating manner, to pads 206 on the package body, as described in conjunction with FIG. 2. Pads 206, in turn, connect to either power or ground planes 314, 316 within the package body through plated or filled vias 318. Because the capacitors 204 are interconnected through different sets of pads 206, vias 318, and power or ground planes 314, 316 within the package, some "lateral" inductance exists between the capacitors. In other words, the lateral current between capacitors 204 is carried over a conductive loop having a loop area that is bounded by various conductive structures (e.g., pads, vias, and power/ground planes) of the package 202. According to existing packaging technologies, where the package has one pair of power and ground planes 314, 316, the loop area results in about 30 picohenrys (pH)/square of lateral inductance. Where the package has two pairs of power and ground planes 314, 316 (as illustrated), the total lateral inductance can be reduced to about 15 pH/square.

The capacitors' terminals 306, 308 are also connected to the integrated circuit load (not shown) through vias 318, thus enabling the capacitors 204 to provide bypassing capacitance to the integrated circuit. Connection of the capacitors 204 to the load through the vias 318 results in some "vertical" inductance, also referred to as "loop" inductance, to exist in the supply and return via loop between each capacitor 204 and the integrated circuit load.

FIG. 4 illustrates an electrical circuit that simulates the electrical characteristics of the capacitors illustrated in FIGS. 1–3. For simplicity, no parasitic resistances of the capacitors are shown in FIG. 4. The circuit shows a die load 402, which may require bypassing capacitance in order to function properly. Some of the bypassing capacitance can be supplied by capacitance, modeled by capacitor 404, located on the die. Other capacitance, however, must be provided off chip, as modeled by off-chip capacitors 406. The off-chip capacitors 406 could be, for example, the DSCs 106, LSCs 108, and/or ECCs 110 illustrated in FIG. 1.

As described previously, lateral inductance, modeled by inductors 408, exists between capacitors 406. In addition, vertical loop inductance, partially modeled by inductor 410, exists between capacitors 406 and die load 402. For simplicity, a vertical loop inductance component for each capacitor is not shown.

Because lateral and vertical inductances tend to slow the response time of off-chip capacitors 406, it is desirable to minimize the magnitudes of these inductances. For LSCs and DSCs, vertical loop inductance can be reduced by using capacitors with interdigital contacts. In addition, vertical loop inductance issues can be addressed by placing off-chip capacitors 406 as electrically close as possible to the die load, such as by using ECCs that may be closer to the load than surface mounted capacitors. Similarly, lateral inductance issues can be addressed by placing adjacent capacitors close to each other. For example, adjacent capacitors may be attached to adjacent pads on the package.

Although these solutions are sufficient in certain cases, as the frequencies and edge rates of electronic devices continue to advance, there is an increasing need for higher levels of bypassing capacitance. In addition, there is a need for capacitance solutions that minimize the lateral inductance present between LSCs, DSCs, and ECCs. Accordingly, there is a need in the art for alternative capacitance solutions in the fabrication and design of electronic assemblies, such as integrated circuit packages.

DETAILED DESCRIPTION OF THE INVENTION

Various embodiments of the present invention provide off-chip capacitance at reduced lateral inductance levels for bypassing, voltage dampening, and supplying charge. The various embodiments can be used to reduce the lateral inductance present between LSCs, DSCs, ECCs or other discrete capacitor configurations. In various embodiments, this is accomplished by using an existing feature inside discrete, multi-layer capacitors. This feature, which is the extremely low lateral inductance inside these capacitors, is exploited by electrically connecting the terminals of adjacent, discrete capacitors together, rather than relying on electrical connections formed from conductive structures within or on the surface of a package.

These direct connections, referred to herein as "lateral connections," result in extremely low lateral inductances between LSCs, DSCs, and ECCs. Basically, the lateral connections of the various embodiments provide lateral current paths between the discrete capacitors. By utilizing lateral connections between the numerous conductive planes within the discrete capacitors, the various embodiments provide a high-frequency current redistribution network for the power delivery system. The effective redistribution of high-frequency current results in substantially reduced system noise and a more effective usage of bypassing capacitors. In addition, by reducing the system noise, the various embodiments can increase manufacturing yields and decrease the number of bypassing capacitors needed, thus reducing costs.

Although the description of the various embodiments refers primarily to using discrete capacitors in conjunction with an integrated circuit package, the various embodiments also could be used in conjunction with other types of packages, interposers, printed circuit boards or other electronic circuit housings. In other words, the various embodiments could be used in conjunction with various types of electronic assemblies, and is not meant to be limited to use with integrated circuit packages. In addition, the various embodiments could be used with a number of different types of packages and packaging technologies. For example, the various embodiments could be used with organic or ceramic packages, and the packaging technologies with which the embodiments could be used include but are not limited to, land grid array (e.g., organic LGA), pin grid array (e.g., plastic PGA or flip chip PGA), ball grid array (e.g., BGA, tape BGA, plastic BGA, flip chip BGA or flip chip tape BGA), tape automated bonding, wire bonding, and beam lead.

Figure 1:
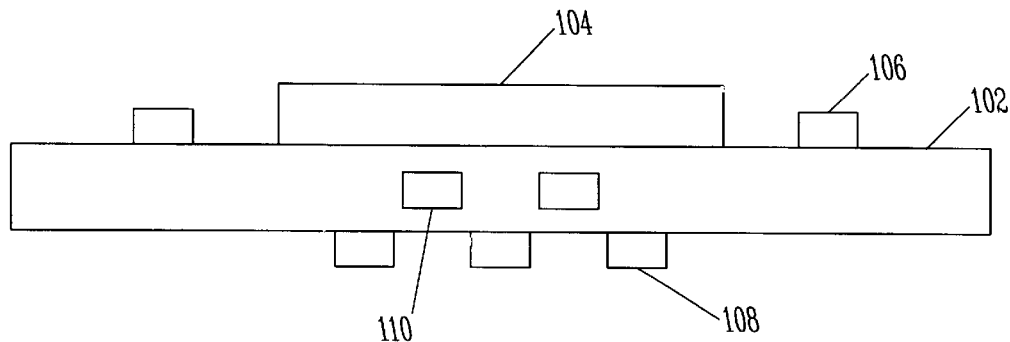
FIG. 1 illustrates a cross-section of an integrated circuit package having die side, land side, and embedded chip capacitors in accordance with the prior art.
Figure 2:
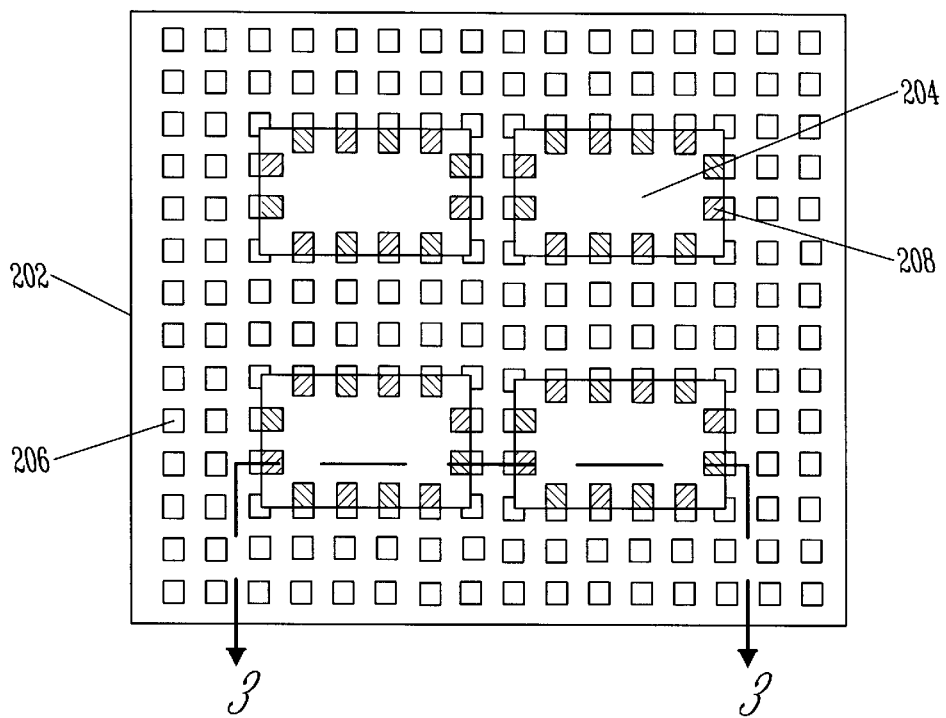
FIG. 2 illustrates a bottom view of an integrated circuit package having multiple LSCs, which are electrically connected to pads on the bottom of the package, in accordance with the prior art.
Figure 3:
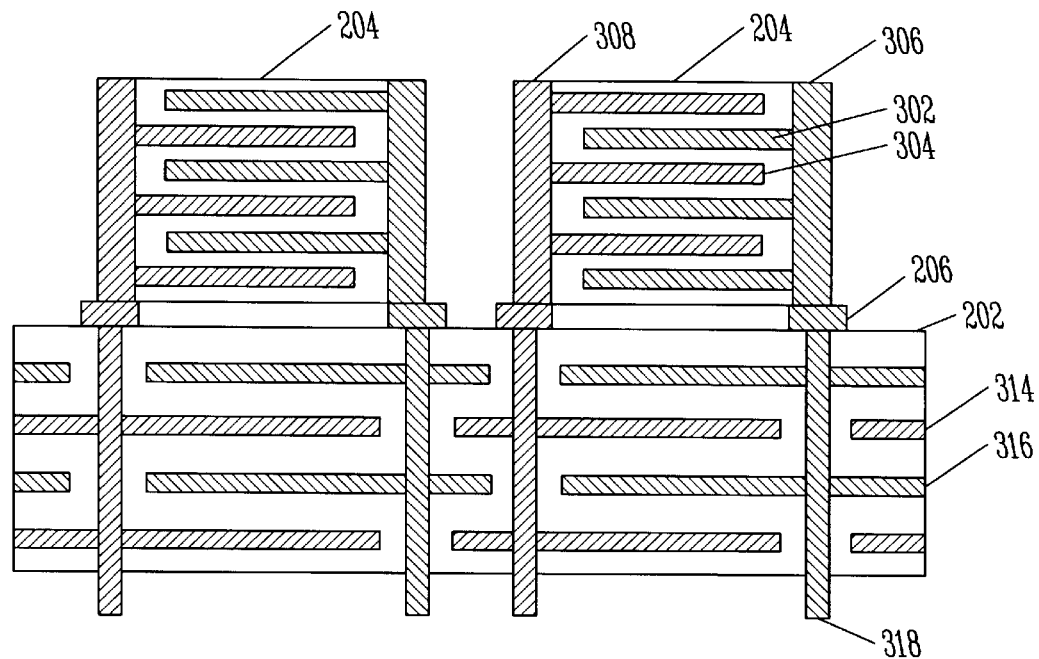
FIG. 3 illustrates a cross-sectional view of a portion of the integrated circuit package and LSCs of FIG. 2 along section lines 3—3.
Figure 4:
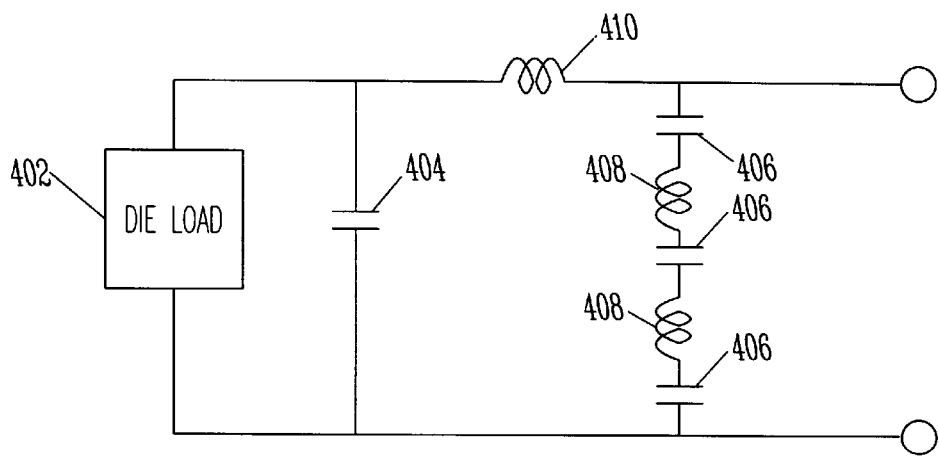
FIG. 4 illustrates an electrical circuit that simulates the electrical characteristics of the capacitors illustrated in FIGS. 1–3.
Figure 5:
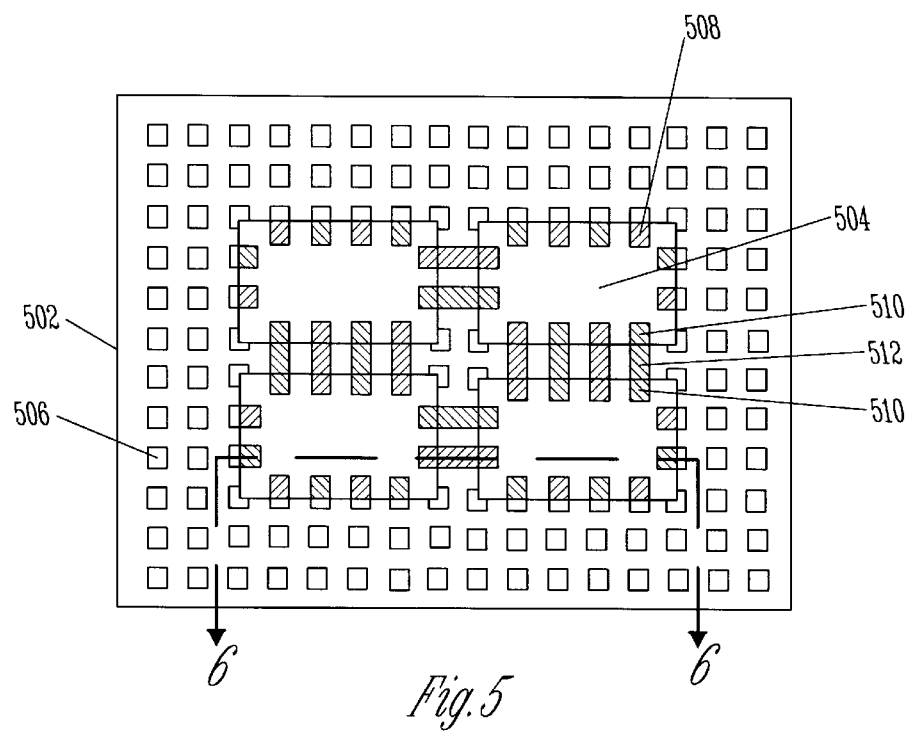
FIG. 5 illustrates a top or bottom view of a portion of an integrated circuit package having multiple surface mounted capacitors, which are electrically connected to pads on the surface of the package, in accordance with one embodiment of the present invention.

FIG. 5 illustrates a top or bottom view of a portion of an integrated circuit package 502 having multiple surface mounted capacitors 504 (e.g., LSCs or DSCs), which are electrically connected to pads 506 on the surface of the package, in accordance with one embodiment of the present invention. Capacitors 504 could be, for example, ceramic chip capacitors, organic capacitors, integrated circuit capacitors or other types of discrete capacitors.

Capacitors 504 include twelve terminals 508 distributed on all four sides. These terminals 508 provide electrical connections to conductive planes of an internal capacitor structure (not shown) within capacitor 504. Going clockwise from the upper left terminal of each capacitor 504, the polarities of the terminals typically alternate between positive and negative, as indicated by the alternating cross-hatched patterns. In other words, the cross-hatching present on terminals 508 is intended to indicate that terminals 508 are connected either to positive or negative interior planes within the capacitors 504, and also that the terminals 508 are connected, in an alternating manner, to power and ground planes (not shown) within the package 502.

As will be exemplified below, capacitors 504 having more or fewer terminals distributed on more or fewer sides also could be used in conjunction with various embodiments. In addition, the polarities of the terminals need not strictly alternate between adjacent terminals. Although only four capacitors 504 are shown in the figure, more or fewer capacitors could be used as well. In some cases, thirty or more capacitors could be used to supply off-chip capacitance to a die.

As the figure indicates, some of the terminals 510 of each capacitor 504 have direct, lateral connections 512 to some of the terminals 510 of adjacent capacitors. Each lateral connection 512 is between adjacent terminals 510 having the same polarity. Accordingly, a positive terminal 510 of a first discrete capacitor would be laterally connected to a positive terminal 510 of a second, adjacent discrete capacitor. This represents a significant distinction between the embodiments of the present invention and the prior art, where no such direct, lateral connections are present.

Terminals of a capacitor 504 could be laterally connected to terminals of one, two or more adjacent capacitors. Accordingly, a capacitor 504 could be laterally connected to other capacitors on one, two or more sides. For example, terminals of each capacitor shown in FIG. 5 are connected on two sides. In addition, although it is not shown in FIG. 5, the terminals on a single side of a particular capacitor could be connected to the terminals on one or multiple adjacent capacitors.

Figure 6:
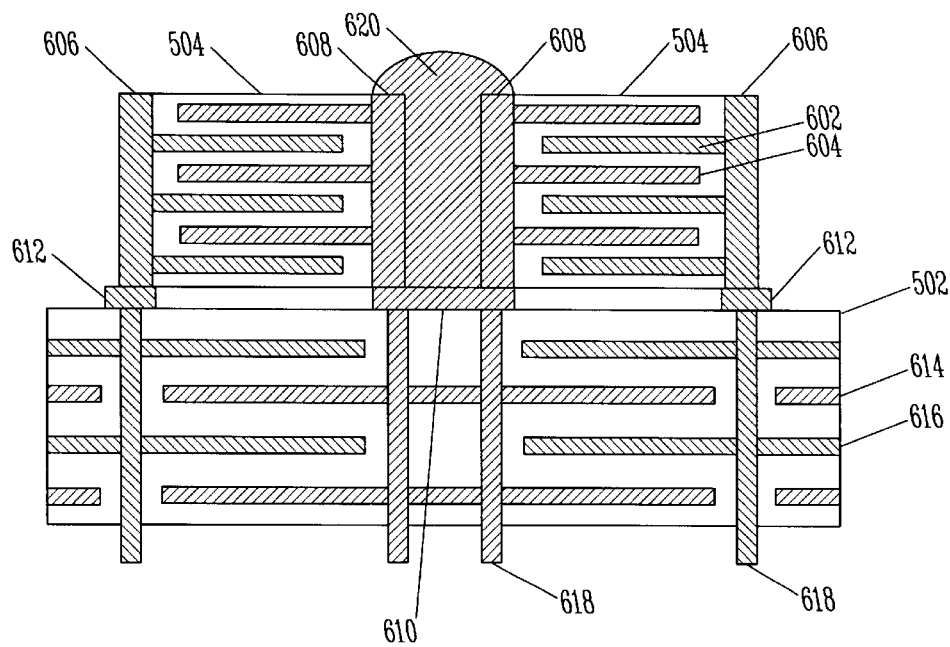
FIG. 6 illustrates a cross-sectional view of a portion of the integrated circuit package and surface mounted capacitors of FIG. 5 along section lines 6—6.

FIG. 6 illustrates a cross-sectional view of a portion of the integrated circuit package 502 and surface mounted capacitors 504 of FIG. 5 along section lines 6—6. When capacitors 504 are multi-layer capacitors, as shown, each capacitor 504 includes multiple interior planes 602, 604 of conductive material, separated by layers of dielectric material. Although only six planes are shown, numerous planes are usually present (e.g., tens or hundreds of planes).

Typically, conductive planes 602, 604 are configured so that alternating planes connect to alternating terminals 606, 608 substantially located on the sides of the capacitor. This enables terminals 606, 608 and planes 602, 604 to be connected, in an alternating manner, to pads 610, 612 on the package body 502, as described in conjunction with FIG. 5. Pads 610, 612, in turn, connect to either power or ground planes 614, 616 within the package body 502 through plated or filled vias 618. For ease of description, FIGS. 6, 8 and 13 do not completely illustrate all of the various conducting and non-conducting layers that a package may have. Layers above and/or below planes 614, 616 may also exist.

In one embodiment, at least one terminal 608 of each capacitor 504 has a direct, lateral connection 620 to a terminal 608 of an adjacent capacitor 504, where the lateral connection 620 is between adjacent terminals 608 having the same polarity. In one embodiment, the lateral connection 620 spans an elongated pad 610, which covers substantially all of the distance between what would otherwise be two, adjacent standard sized pads (e.g., standard sized pads 612). This enables capacitors 504 to be placed on the package with the equivalent of a standard pad pitch of distance between them. Shorter or longer elongated pads could be used as well.

In one embodiment, the lateral connection 620 is achieved using a conductive material 620 between the adjacent terminals 608. This conductive material 620 could be, in various embodiments, solder or a cured, conductive paste or adhesive, for example. The conductive material 620 could also be used to connect the capacitors 504 to the package pads 610, 612, or separate applications of conductive material could be used to achieve the capacitor-to-pad and capacitor-to-capacitor connections.

Because the capacitors 504 are interconnected directly through lateral connections 620, and are not interconnected only through conductive structures within the package (e.g., combinations of pads, vias, and power or ground planes), the lateral inductance between the capacitors 504 is substantially reduced. In other words, the lateral current between capacitors 504 is carried substantially over the lateral connection 620, rather than over a conductive loop having a loop area that is bounded by various conductive structures of the package. Accordingly, the lateral connections have been shown to reduce the lateral inductance to fractions of picohenrys (e.g., 0.03 pH/square or less) from the tens of picohenrys that result from using prior art technologies. By utilizing lateral connections 620 between the conductive planes 602, 604 within the discrete capacitors 504, a high-frequency current redistribution network for the power delivery system is provided.

Figure 7:
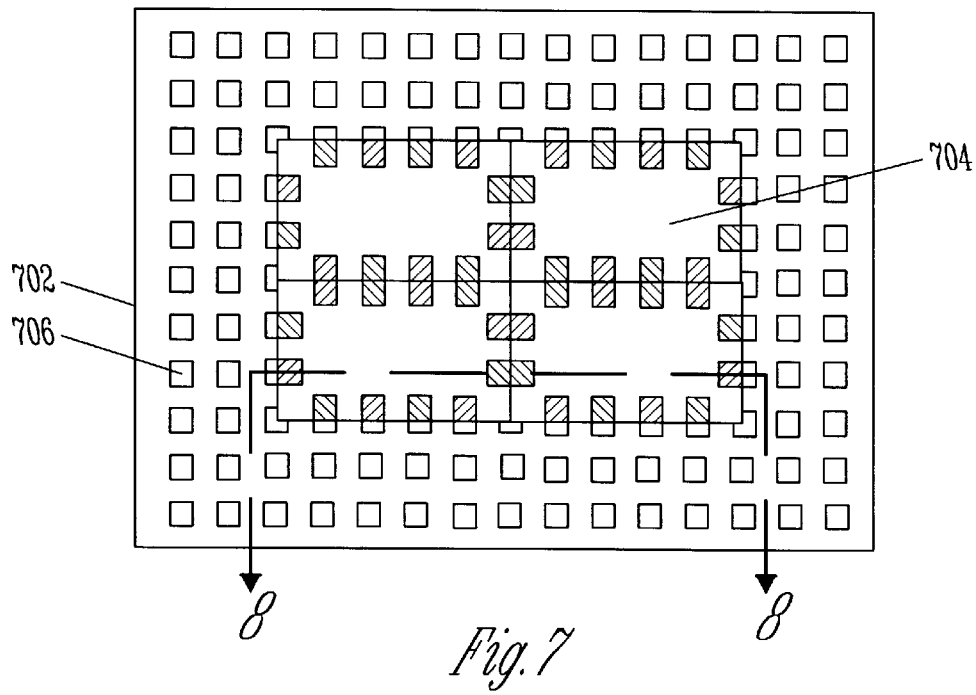
FIG. 7 illustrates a top or bottom view of a portion of an integrated circuit package having multiple surface mounted capacitors, which are electrically connected to pads on the surface of the package, in accordance with another embodiment of the present invention.

FIG. 7 illustrates a top or bottom view of a portion of an integrated circuit package 702 having multiple surface mounted capacitors 704 (e.g., LSCs or DSCs), which are electrically connected to pads 706 on the surface of the package, in accordance with another embodiment of the present invention. Essentially, the embodiment illustrated in FIG. 7 is similar to the embodiment illustrated in FIG. 5, except that little or no physical distance exists between adjacent capacitors 704. In this embodiment, adjacent capacitors 704 are in physical contact with each other or have a negligible distance between each other.

Figure 8:
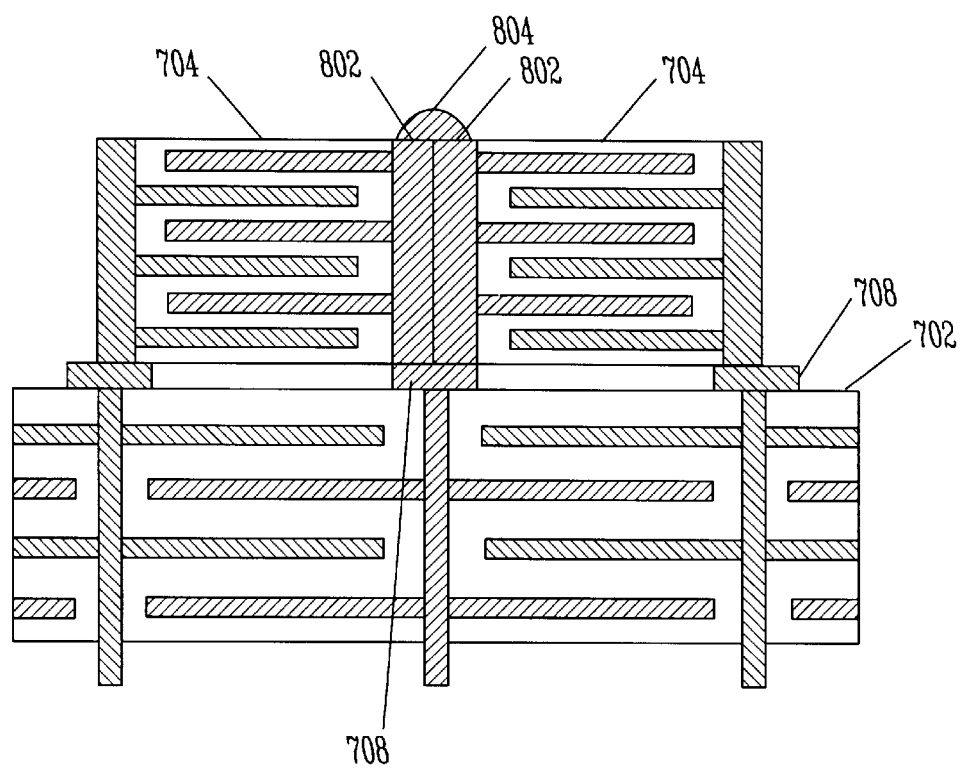
FIG. 8 illustrates a cross-sectional view of a portion of the integrated circuit package and surface mounted capacitors of FIG. 7 along section lines 8—8.

FIG. 8 illustrates a cross-sectional view of a portion of the integrated circuit package 702 and surface mounted capacitors 704 of FIG. 7 along section lines 8—8. The embodiment illustrated in FIG. 8 is similar to the embodiment illustrated in FIG. 6, except that little or no distance exists between adjacent terminals 802 of capacitors 704. Accordingly, the lateral connection between terminals 802 is accomplished by physical contact, in one embodiment. In the embodiment illustrated, both capacitors 704 can be connected to a standard sized pad 708 on the package 702.

The lateral connection is further achieved, in one embodiment, using a conductive material 804 between the adjacent terminals 802. This conductive material 804 could be, in various embodiments, solder or a cured, conductive paste or adhesive, for example. As with the embodiment illustrated in FIG. 6, the conductive material 804 could also be used to connect the capacitors 704 to the package pads 708, or separate applications of conductive material could be used to achieve the capacitor-to-pad and capacitor-to-capacitor connections.

Figure 9:
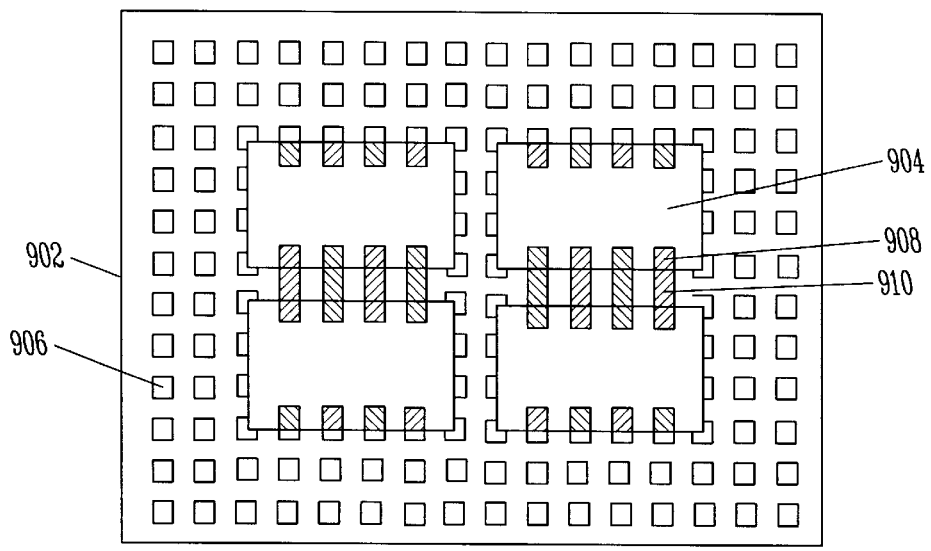
FIG. 9 illustrates a top or bottom view of a portion of an integrated circuit package having multiple surface mounted capacitors, which are electrically connected to pads on the surface of the package, in accordance with another embodiment of the present invention.

FIG. 9 illustrates a top or bottom view of a portion of an integrated circuit package 902 having multiple surface mounted capacitors 904 (e.g., LSCs or DSCs), which are electrically connected to pads 906 on the surface of the package, in accordance with another embodiment of the present invention. Capacitors 904 include eight terminals 908 distributed on two sides. Lateral connections 910 are present between adjacent, same-polarity terminals of adjacent capacitors 904. Because capacitors 904 have terminals 908 on only two sides, however, these lateral connections 910 are present on only two sides. FIG. 9 is intended to illustrate that lateral connections can be made between capacitors having various numbers of terminals on various numbers of sides. The embodiment shown in FIG. 9 shows the capacitors 904 as being physically separated from each other. In other embodiments, capacitors 904 could be in physical contact with each other, or have a negligible distance between each other, as was illustrated in FIGS. 7 and 8.

Figure 10:
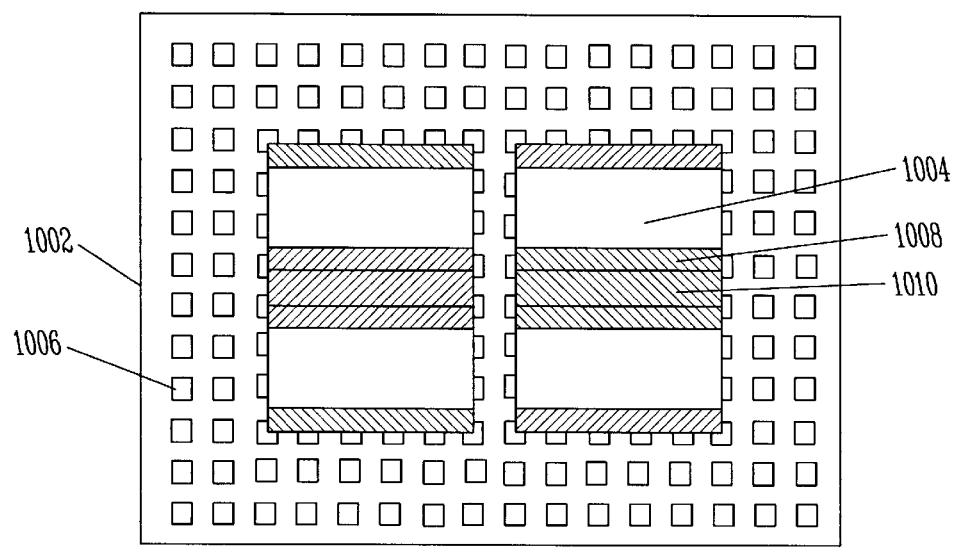
FIG. 10 illustrates a top or bottom view of a portion of an integrated circuit package having multiple surface mounted capacitors, which are electrically connected to pads on the surface of the package, in accordance with another embodiment of the present invention.

As another example, FIG. 10 illustrates a top or bottom view of a portion of an integrated circuit package 1002 having multiple surface mounted capacitors 1004 (e.g., LSCs or DSCs), which are electrically connected to pads 1006 on the surface of the package, in accordance with another embodiment of the present invention. In this embodiment, capacitors 1004 are two-terminal, discrete capacitors. Commonly, although not necessarily, these types of capacitors include terminals 1008 that extend the entire length of the sides of the capacitor 1004. Because terminals 1008 are longer than many capacitors with more terminals, elongated lateral connections 1010 are present between same-polarity terminals of adjacent capacitors 1004. The elongated lateral connections 1010 are made to span enlarged pads (not shown) on the package surface, in one embodiment. These enlarged pads have a shape that facilitates the formation of lateral connections 1010 out of a conductive material, such as solder or a cured, conductive paste or adhesive, for example. The embodiment shown in FIG. 10 shows the capacitors 1004 as being physically separated from each other. In other embodiments, capacitors 1004 could be in physical contact with each other, or have a negligible distance between each other, as was illustrated in FIGS. 7 and 8.

Figure 11:
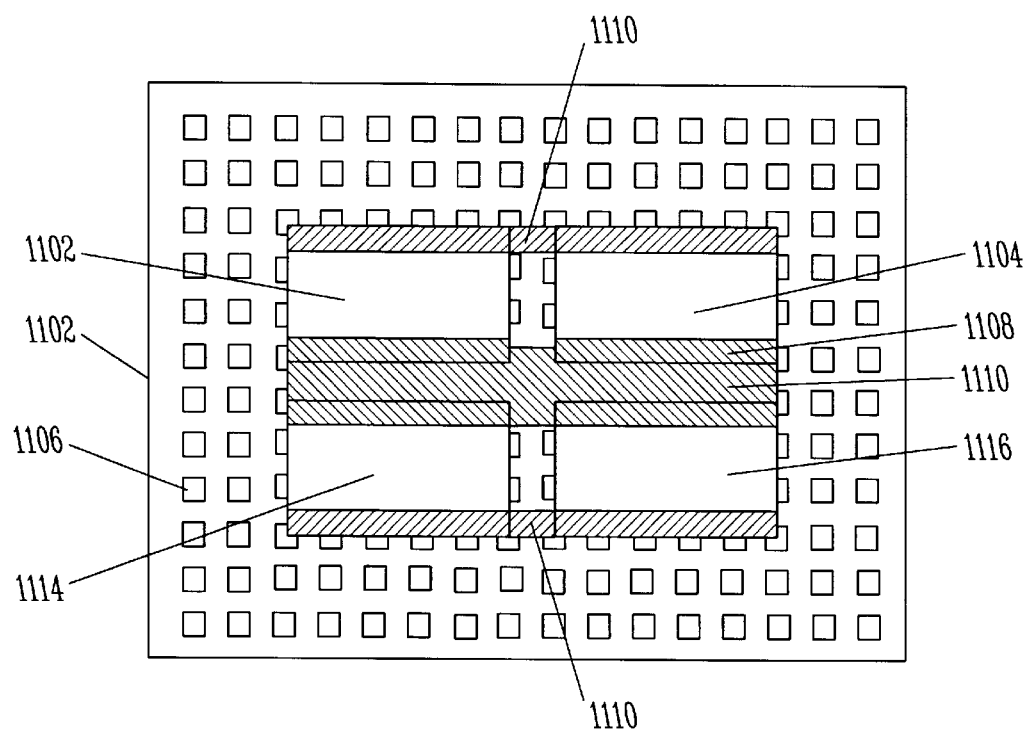
FIG. 11 illustrates a top or bottom view of a portion of an integrated circuit package having multiple surface mounted capacitors, which are electrically connected to pads on the surface of the package, in accordance with another embodiment of the present invention.

FIG. 11 illustrates a top or bottom view of a portion of an integrated circuit package 1102 having multiple surface mounted capacitors 1104, 1112, 1114, 1116 (e.g., LSCs or DSCs), which are electrically connected to pads 1106 on the surface of the package, in accordance with another embodiment of the present invention. The embodiment illustrated in FIG. 11 is similar to the embodiment illustrated in FIG. 10, except that adjacent terminals 1108 on adjacent capacitors not only have lateral connections 1110 in the vertical direction (e.g., between capacitors 1112 and 1114), but the terminals 1108 also have lateral connections 1110 in the horizontal direction (e.g., between capacitors 1114 and 1116). The enlarged lateral connections 1110 are made to span enlarged pads (not shown) on the package surface, in one embodiment. FIG. 11 illustrates that, when a particular terminal contacts more than one side of the capacitor, lateral connections to the terminal can be made on more than one side of the capacitor, as shown. The embodiment shown in FIG. 11 shows the capacitors 1104, 1112, 1114, 1116 as being physically separated from each other. In other embodiments, capacitors 1104, 1112, 1114, 1116 could be in physical contact with each other, or have a negligible distance between each other, as was illustrated in FIGS. 7 and 8.

Figure 12:
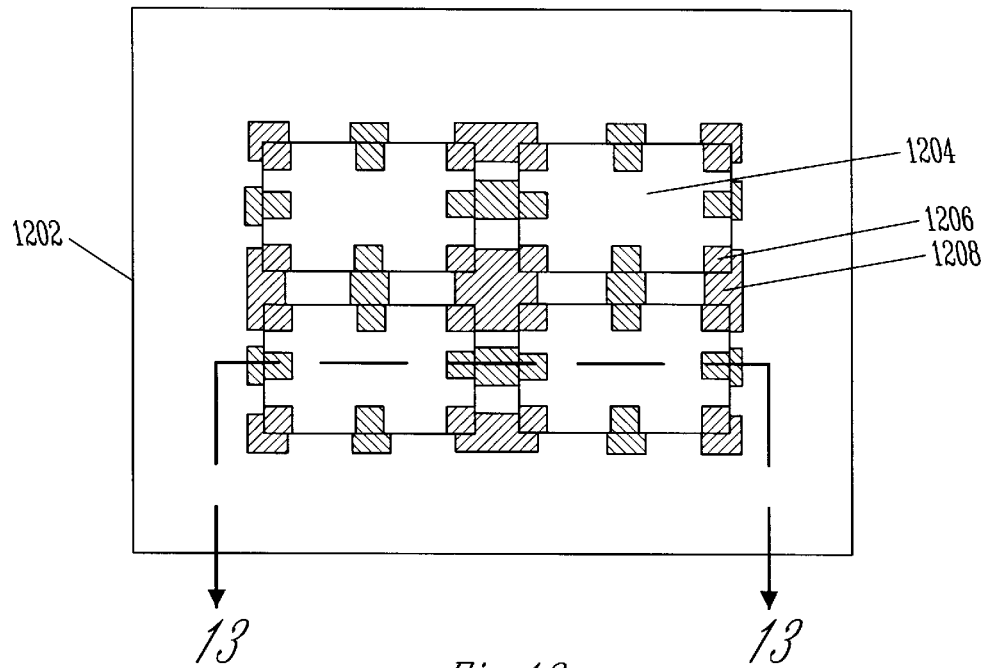
FIG. 12 illustrates an interior, top or bottom view of an integrated circuit package having multiple ECCS, in accordance with one embodiment of the present invention.

FIG. 12 illustrates an interior, top or bottom view of an integrated circuit package 1202 having multiple embedded chip capacitors 1204 (ECCs), in accordance with one embodiment of the present invention. The embodiment illustrated in FIG. 12 is similar to the embodiment illustrated in FIG. 5, except that the ECCs are embedded within the package 1202, and the terminals 1206 of the ECCs 1204 are connected to conductive structures (e.g., traces and/or vias) within the package 1202, rather than to pads on the surface of the package. The lateral connections 1208 between terminals 1206 of adjacent ECCs 1204 are made in a similar manner to those discussed in conjunction with FIGS. 5 and 6.

Figure 13:
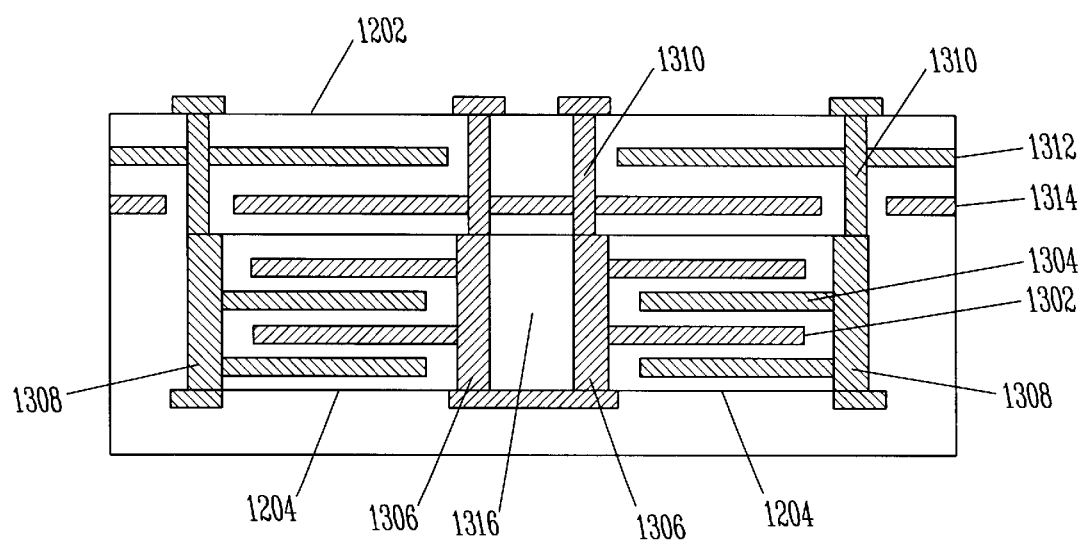
FIG. 13 illustrates a cross-sectional view of a portion of the integrated circuit package and ECCs of FIG. 12 along section lines 13—13.

FIG. 13 illustrates a cross-sectional view of a portion of the integrated circuit package 1202 and ECCs 1204 of FIG. 12 along section lines 13—13. Similar to the surface mount capacitors described previously, when capacitors 1204 are multi-layer capacitors, as shown, each capacitor 1204 includes multiple interior planes 1302, 1304 of conductive material, separated by layers of dielectric material.

Typically, conductive planes 1302, 1304 are configured so that alternating planes connect to alternating terminals 1306, 1308 around the capacitor. This enables terminals 1306, 1308 and planes 1302, 1304 to be connected, in an alternating manner, to conductive structures within the package body. These conductive structures can be vias 1310, such as illustrated in FIG. 13, or they can be conductive traces or planes (not shown) within the package. The conductive structures, in turn, connect to either power or ground planes 1312, 1314 within the package body. In the embodiment shown, vias 1310 make contact with terminals 1306, 1308 from the top of capacitors 1204. In other embodiments, one or more vias could make contact with terminals 1306, 1308 from the bottom of capacitors 1204.

FIG. 13 does not completely illustrate the various conducting and nonconducting layers of package 1202, for ease of description. In an actual package design, one or more additional conducting and/or non-conducting layers could exist above, below, or in parallel with capacitors 1204. In order to minimize the loop inductance between capacitors 1204 and a die load, it may be desirable to embed capacitors 1204 as close to the top surface of the package 1202 as possible, although this is not essential. The capacitors could be embedded in one or multiple layers of a single package.

In one embodiment, at least one terminal 1306 of each capacitor 1204 has a direct, lateral connection 1316 to a terminal 1306 of an adjacent capacitor 1204, where the lateral connection 1316 is between adjacent terminals 1306 having the same polarity. The lateral connection 1316 spans the distance between the adjacent terminals 1306. In various other embodiments, the adjacent terminals 1306 can be in physical contact (e.g., with little or no distance between them), or they can be separated by some non-negligible distance.

In one embodiment, the lateral connection 1316 is achieved using a conductive material 1316 between the adjacent terminals 1306. This conductive material 1316 could be, in various embodiments, solder or a cured, conductive paste or adhesive, for example. The conductive material 1316 could also be used to connect the capacitors 1304 to the package's internal conductive structures, or separate applications of conductive material could be used to achieve the capacitor-to-package and capacitor-to-capacitor connections.

In various embodiments, each capacitor 504, 704, 904, 1004, 1104, and 1204, illustrated in FIGS. 5–13 could be a ceramic capacitor, aluminum oxide capacitor, organic capacitor or a capacitor made with many other technologies, as would be obvious to one of skill in the art based on the description herein. In addition, the actual and relative dimensions of capacitors 504, 704, 904, 1004, 1104, and 1204 could vary widely, depending on design and manufacturing constraints or other factors. In addition, capacitors 504, 704, 904, 1004, 1104, and 1204 need not necessarily be rectangular in shape, as they could assume a number of different shapes (e.g., square or multi-sided).

Figure 14:
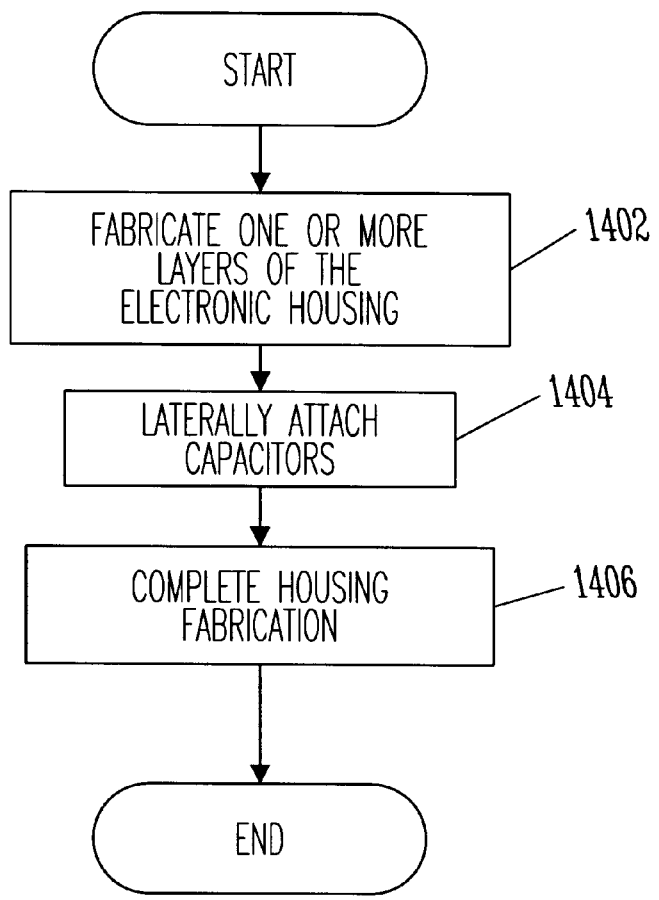
FIG. 14 illustrates a flowchart of a method for manufacturing an electronic assembly having laterally connected capacitors in accordance with one embodiment of the present invention.

FIG. 14 illustrates a flowchart of a method for manufacturing an electronic assembly having laterally connected capacitors in accordance with one embodiment of the present invention. The method begins, in block 1402, by fabricating one or more layers of an electronic housing. The electronic housing could be, for example, an integrated circuit package, other type of package, interposer, printed circuit (PC) board, or other type of electronic circuit housing. The details regarding fabricating the housing layer(s) depend entirely on the type of packaging technology used, and a discussion of the various packaging technology fabrication methods are outside of the scope of this invention. Fabrication of the electronic housing layers results in a rigid structure with conductive pads on its surface and/or other exterior or interior conductive structures.

In block 1404, two or more discrete capacitors are laterally attached to the electronic housing. Where the discrete capacitors are LSCs or DSCs, lateral attachment involves attaching the capacitors to pads on the surface of the electronic housing, so that one or more terminals of one or more adjacent capacitors are attached together with a lateral connection (e.g., connection 620, FIG. 6). Attachment of the capacitors to the housing and to each other can be done in separate processes, or can be done simultaneously. For example, the discrete capacitors can first be surface mounted to the housing pads, and then the adjacent capacitors' terminals can be laterally attached in a separate process. Alternatively, the surface mounting and lateral attachment can be performed simultaneously, for example, by soldering the pads and adjacent terminals together at the same time. Alternatively, a cured, conductive paste or adhesive could be used to provide the capacitor-to-pad and/or lateral connections.

Where the discrete capacitors are ECCs, the capacitors would be placed on the top layer of the partial housing or within depressions within the housing. The ECCs would then be laterally attached to each other and/or to conductive structures within the housing using one or several processes.

After laterally attaching the discrete capacitors, the housing fabrication is completed, if necessary, in block 1406. In the case of ECCs, this may include building up one or more additional layers of patterned conductive and dielectric materials over the ECCs, including the formation of vias and/or other conductive structures. The process then ends.

Figure 15:
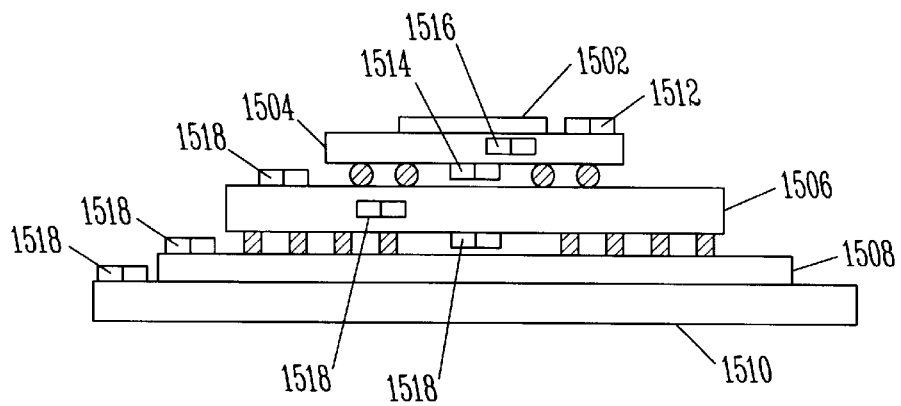
FIG. 15 illustrates an integrated circuit package, interposer, socket, and printed circuit board, each of which could include one or more sets of laterally connected capacitors in accordance with various embodiments of the present invention.

As described previously, laterally connected capacitors, such as those described in the various embodiments above, can be included on or within an integrated circuit package, interposer, socket, PC board, and/or other types of electronic circuit housing. FIG. 15 illustrates an integrated circuit package 1504, interposer 1506, socket 1508, and PC board 1510, each of which could include two or more laterally connected capacitors in accordance with various embodiments of the present invention.

Starting from the top of FIG. 15, an integrated circuit 1502 is housed by integrated circuit package 1504. Integrated circuit 1502 contains one or more circuits, which are electrically connected to integrated circuit package 1504 by connectors (not shown).

Integrated circuit 1502 could be any of a number of types of integrated circuits. In one embodiment of the present invention, integrated circuit 1502 is a microprocessor. In other embodiments, integrated circuit 1502 could be a memory device, application specific integrated circuit, digital signal processor, or another type of device. In the example shown, integrated circuit 1502 is a "flip chip" type of integrated circuit, meaning that the input/output terminations on the chip can occur at any point on its surface. After the chip has been readied for attachment to integrated circuit package 1504, it is flipped over and attached, via solder bumps or balls to matching pads on the top surface of integrated circuit package 1504. Alternatively, integrated circuit 1502 could be wire bonded, where input/output terminations are connected to integrated circuit package 1504 using bond wires to pads on the top surface of integrated circuit package 1504, or otherwise connected to package 1504.

One or more of the circuits within integrated circuit 1502 acts as a load, which may require bypassing capacitance for noise or radiation suppression, and/or voltage dampening. Some of this capacitance is provided, in one embodiment of the present invention, by laterally connected DSCs 1512, LSCs 1514, and/or ECCs 1516, which are surface mounted on and/or embedded within package 1504. In this manner, one or more levels of additional capacitance are provided to integrated circuit 1502. In other embodiments, laterally connected capacitors 1518 are surface mounted on and/or embedded within interposer 1506, socket 1508, and/or PC board 1510.

Integrated circuit package 1504 is coupled to interposer 1506 using solder connections, such as ball grid array connections, for example. In another embodiment, integrated circuit package 1504 could be electrically and physically connected to interposer 1506 using a pinned or other type of connection.

Interposer 1506 is coupled to PC board 1510 through a socket 1508 on PC board 1510. In the example shown, interposer 1506 includes pins, which mate with complementary pin holes in socket 1508. Alternatively, interposer 1506 could be electrically and physically connected to PC board 1510 using solder connections, such as ball grid array connections, for example. In still another alternate embodiment, integrated circuit package 1504 could be connected directly to socket 1508 and/or PC board 1510, without using an interposer. In such an embodiment, integrated circuit package 1504 and PC board 1510 could be electrically and physically connected using ball grid array or pinned connections. Other ways of connecting integrated circuit package 1504 and PC board 1510 could also be used in other embodiments.

PC board 1510 could be, for example, a motherboard of a computer or other electronic system. As such, it acts as a vehicle to supply power, ground, and signals to integrated circuit 1502. These power, ground, and other signals are supplied through traces or planes (not shown) on or within PC board 1510, socket 1508, interposer 1506, and integrated circuit package 1504.

Figure 16:
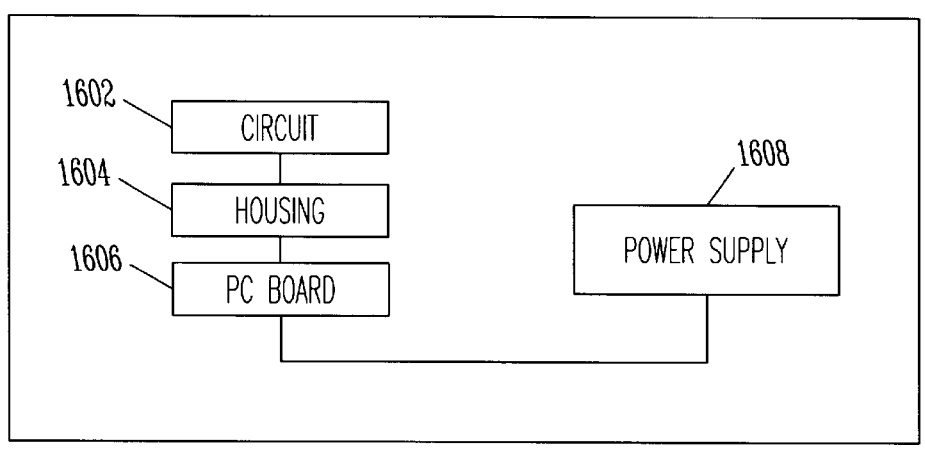
FIG. 16 illustrates an electronic system in accordance with one embodiment of the present invention.

The configurations described above in conjunction with various embodiments could form part of an electronic system. FIG. 16 illustrates an electronic system in accordance with one embodiment of the present invention. The system shown in FIG. 16 could be, for example, a computer, a wireless or wired communication device (e.g., telephone, modem, cell phone, pager, radio, etc.), a television, a monitor, or virtually any other type of electronic system that could benefit from the use of laterally connected capacitors.

The electronic system includes circuit 1602, housing 1604, PC board 1606, and power supply 1608. Housing 1604 and/or PC board 1606 include two or more laterally connected capacitors surface mounted on or embedded within them, in accordance with various embodiments of the present invention.

CONCLUSION

Various embodiments of an electronic assembly with laterally connected capacitors and methods of fabricating that assembly have been described, along with a description of the incorporation of the assembly within an electronic system. The various embodiments can be used to reduce the lateral inductance present between LSCs, DSCs, ECCs or other discrete capacitor configurations. In various embodiments, the extremely low lateral inductance inside multi-layer capacitors is exploited by electrically connecting the terminals of adjacent, discrete capacitors together, rather than relying on electrical connections formed from conductive structures within or on the surface of the package. These lateral connections result in extremely low lateral inductances between LSCs, DSCs, and ECCs. By utilizing lateral connections between the numerous conductive planes within the discrete capacitors, the various embodiments provide a high-frequency current redistribution network for the power delivery system.

While the foregoing examples of dimensions and ranges are considered typical, the various embodiments of the invention are not limited to such dimensions or ranges. It is recognized that the trend within industry is to generally reduce device dimensions for the associated cost and performance benefits.

In the foregoing detailed description, reference is made to the accompanying drawings, which form a part hereof, and in which are shown by way of illustration specific embodiments in which the invention may be practiced. These embodiments are described in sufficient detail to enable those skilled in the art to practice the invention.

It will be appreciated by those of ordinary skill in the art that any arrangement, which is calculated to achieve the same purpose, may be substituted for the specific embodiment shown. For example, although some of the figures show four discrete capacitors arranged in a square pattern, more or fewer capacitors could be used, and they could be arranged in other pattern configurations, including linear, ring or irregularly shaped configurations.

The various embodiments have been described in the context of providing excess, off-chip capacitance to a die. One of ordinary skill in the art would understand, based on the description herein, that the method and apparatus of the present invention could also be applied in many other applications where a capacitor configuration having a low lateral inductance is desired. Therefore, all such applications are intended to fall within the spirit and scope of the present invention.

This application is intended to cover any adaptations or variations of the present invention. The foregoing detailed description is, therefore, not to be taken in a limiting sense, and it will be readily understood by those skilled in the art that various other changes in the details, materials, and arrangements of the parts and steps, which have been described and illustrated in order to explain the nature of this invention, may be made without departing from the spirit and scope of the invention as expressed in the adjoining claims.

What is claimed is:

1. An electronic assembly comprising:
   a first discrete capacitor attached to a housing, the first discrete capacitor having multiple first interior planes, wherein a set of the multiple first interior planes electrically connects to a first conductive terminal on a side of the first discrete capacitor; and
   a second discrete capacitor attached to the housing, the second discrete capacitor having multiple second interior planes, wherein a set of the multiple second interior planes electrically connects to a second conductive terminal on a side of the second discrete capacitor, and wherein the second conductive terminal is laterally attached to the first conductive terminal.

2. The electronic assembly as claimed in claim 1, further comprising one or more additional discrete capacitors having one or more additional terminals that are directly attached to one or more terminals of the first discrete capacitor, the second discrete capacitor, or other capacitors.

3. The electronic assembly as claimed in claim 2, further comprising a third discrete capacitor, wherein a third conductive terminal on a side of the third discrete capacitor is attached to a fourth conductive terminal on a second side of the first discrete capacitor.

4. The electronic assembly as claimed in claim 1, wherein the first conductive terminal and the second conductive terminal are attached by physical contact.

5. The electronic assembly as claimed in claim 1, wherein the first conductive terminal and the second conductive terminal are attached by a conductive material between the first conductive terminal and the second conductive terminal.

6. The electronic assembly as claimed in claim 5, wherein the first discrete capacitor and the second discrete capacitor are surface mounted capacitors, and the first conductive terminal and the second conductive terminal are attached together by the conductive material, which spans a length of a pad on a surface of the housing.

7. The electronic assembly as claimed in claim 1, wherein the housing is an integrated circuit package, and the first discrete capacitor and the second discrete capacitor are mounted on a land side of the integrated circuit package.

8. The electronic assembly as claimed in claim 1, wherein the housing is an integrated circuit package, and the first discrete capacitor and the second discrete capacitor are mounted on a die side of the integrated circuit package.

9. The electronic assembly as claimed in claim 1, wherein the housing is an integrated circuit package, and the first discrete capacitor and the second discrete capacitor are embedded within the integrated circuit package.

10. The electronic assembly as claimed in claim 1, wherein the first discrete capacitor and the second discrete capacitor are ceramic chip capacitors.

11. The electronic assembly as claimed in claim 1, wherein the first discrete capacitor and the second discrete capacitor are organic capacitors.

12. The electronic assembly as claimed in claim 1, further comprising a conductive material between the first conductive terminal and the second conductive terminal.

13. The electronic assembly as claimed in claim 12, wherein the conductive material is a solder material.

14. The electronic assembly as claimed in claim 12, wherein the conductive material is a cured, conductive paste.

15. The electronic assembly as claimed in claim 1, further comprising the housing, wherein the housing is an integrated circuit package.

16. A method for manufacturing an electronic assembly, the method comprising:
   attaching a first discrete capacitor to an electronic housing, wherein the first discrete capacitor has multiple first interior planes, and a set of the multiple first interior planes electrically connects to a first conductive terminal on a side of the first discrete capacitor;
   attaching a second discrete capacitor to the electronic housing, wherein the second discrete capacitor has multiple second interior planes, and a set of the multiple second interior planes electrically connects to a second conductive terminal on a side of the second discrete capacitor; and
   laterally attaching the second conductive terminal to the first conductive terminal.

17. The method as claimed in claim 16, wherein the first discrete capacitor and the second discrete capacitor are attached to the electronic housing by surface mounting the first discrete capacitor and the second discrete capacitor to the electronic housing.

18. The method as claimed in claim 16, wherein the first discrete capacitor and the second discrete capacitor are attached to the electronic housing by embedding the first discrete capacitor and the second discrete capacitor within the electronic housing.

19. The method as claimed in claim 16, further comprising laterally attaching one or more additional capacitors to the first discrete capacitor or the second discrete capacitor.

20. The method as claimed in claim 16, wherein laterally attaching the second conductive terminal to the first conductive terminal comprises soldering the second conductive terminal and the first conductive terminal together.

21. The method as claimed in claim 16, wherein laterally attaching the second conductive terminal comprises depositing a conductive paste in contact with the first conductive terminal and the second conductive terminal and curing the conductive paste.

22. An electronic housing comprising:
one or more layers of patterned, conductive material;
a first discrete capacitor attached to the one or more layers, the first discrete capacitor having multiple first interior planes, wherein a set of the multiple first interior planes electrically connects to a first conductive terminal on a side of the first discrete capacitor; and
a second discrete capacitor attached to the one or more layers, the second discrete capacitor having multiple second interior planes, wherein a set of the multiple second interior planes electrically connects to a second conductive terminal on a side of the second discrete capacitor, and wherein the second conductive terminal is laterally attached to the first conductive terminal.

23. The electronic housing as claimed in claim 22, wherein the first discrete capacitor and the second discrete capacitor are embedded within the electronic housing.

24. The electronic housing as claimed in claim 22, wherein the first discrete capacitor and the second discrete capacitor are mounted on a surface of the housing.

25. The electronic housing as claimed in claim 22, wherein the electronic housing is an integrated circuit package.

26. An electronic system comprising:
a housing;
a first discrete capacitor attached to the housing, the first discrete capacitor having multiple first interior planes, wherein a set of the multiple first interior planes electrically connects to a first conductive terminal on a side of the first discrete capacitor; and
a second discrete capacitor attached to the housing, the second discrete capacitor having multiple second interior planes, wherein a set of the multiple second interior planes electrically connects to a second conductive terminal on a side of the second discrete capacitor, and wherein the second conductive terminal is laterally attached to the first conductive terminal.

27. The electronic system as claimed in claim 26, wherein the first discrete capacitor and the second discrete capacitor are embedded within the housing.

28. The electronic system as claimed in claim 26, wherein the first discrete capacitor and the second discrete capacitor are mounted on a surface of the housing.

29. The electronic system as claimed in claim 26, wherein the housing is an integrated circuit package.

* * * * *